United States Patent
Ashizawa et al.

(10) Patent No.: US 8,295,969 B2
(45) Date of Patent: Oct. 23, 2012

(54) COMBINATORIAL PROCESSING MANAGEMENT SYSTEM

(75) Inventors: Yoshiki Ashizawa, Pleasanton, CA (US); Heng-Cheng Pai, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/174,941

(22) Filed: Jul. 1, 2011

(65) Prior Publication Data

US 2011/0264252 A1    Oct. 27, 2011

Related U.S. Application Data

(63) Continuation of application No. 11/829,749, filed on Jul. 27, 2007.

(51) Int. Cl.
*G06F 19/00*    (2006.01)

(52) U.S. Cl. ........ 700/121; 700/108; 700/111; 700/115; 438/14

(58) Field of Classification Search .......... 700/108–111, 700/115, 121, 164; 438/14; 702/82
See application file for complete search history.

(56) References Cited

U.S. PATENT DOCUMENTS

| | | | |
|---|---|---|---|
| 6,638,778 B1 * | 10/2003 | Peterson et al. | 438/14 |
| 6,666,337 B1 * | 12/2003 | Conboy et al. | 209/546 |
| 6,869,807 B2 * | 3/2005 | Yoshitake et al. | 438/7 |
| 6,934,596 B2 * | 8/2005 | Yoshida et al. | 700/109 |
| 2003/0049376 A1 * | 3/2003 | Schwarm et al. | 427/255.28 |
| 2007/0192064 A1 * | 8/2007 | Nakamura et al. | 702/185 |

* cited by examiner

*Primary Examiner* — Sean Shechtman

(57) ABSTRACT

A combinatorial processing management system is described, including determining an identification for a substrate, retrieving data from tools operating on the substrate, generating an analysis of the data in response to the retrieving, and storing the data and the analysis in a database indexed by the identification. The analysis may include comparisons between multiple processes performed on multiple regions of the substrate. The multiple processes may process at least one region of the substrate differently from at least one other region of the substrate.

8 Claims, 10 Drawing Sheets

COMBINATORIAL PROCESSING MANAGEMENT SYSTEM

CROSS-REFERENCE TO RELATED APPLICATIONS

This application is a Continuation of U.S. patent application Ser. No. 11/829,749 entitled "Combinatorial Processing Management System" filed on Jul. 27, 2007 which is herein incorporated by reference. This application is related to U.S. patent application Ser. No. 11/771,836, entitled "Substrate Processing Recipe Manager" and filed on Jun. 29, 2007, which is herein incorporated by reference.

FIELD OF THE INVENTION

The present invention relates generally to semiconductor processing. More specifically, software for managing combinatorial semiconductor processing is described.

BACKGROUND OF THE INVENTION

Semiconductor processing typically includes various techniques performed on a substrate (e.g., a wafer) to form electronic devices such as integrated circuits. Examples of such techniques include layer deposition (e.g., using electroless or electrochemical deposition, physical vapor deposition, or chemical vapor deposition), cleaning techniques, and chemical mechanical planarization.

These and other techniques are performed using semiconductor processing tools. For example, tools include physical vapor deposition (PVD) or sputtering tools for depositing layers, spin processors for distributing chemicals such as during a cleaning process, and chemical mechanical planarization (CMP) tools for performing CMP.

Integrated circuits can be formed by processing semiconductor wafers. Wafers are tracked during semiconductor processing using wafer tracking systems. Wafer tracking systems are software programs that track whether a wafer has been processed with a tool. For example, a wafer tracking system keeps a list of tools and processes with which a particular wafer has been processed. These systems provide limited information, and provide information that is only useful in a production environment. Some wafer tracking systems can also track test results of multiple, individual dies on wafers to determine where failures have occurred.

Thus, what is needed is a system for monitoring semiconductor processes for experimentation and evaluation.

BRIEF DESCRIPTION OF THE DRAWINGS

Various embodiments of the invention are disclosed in the following detailed description and the accompanying drawings.

DETAILED DESCRIPTION

Figure 1:
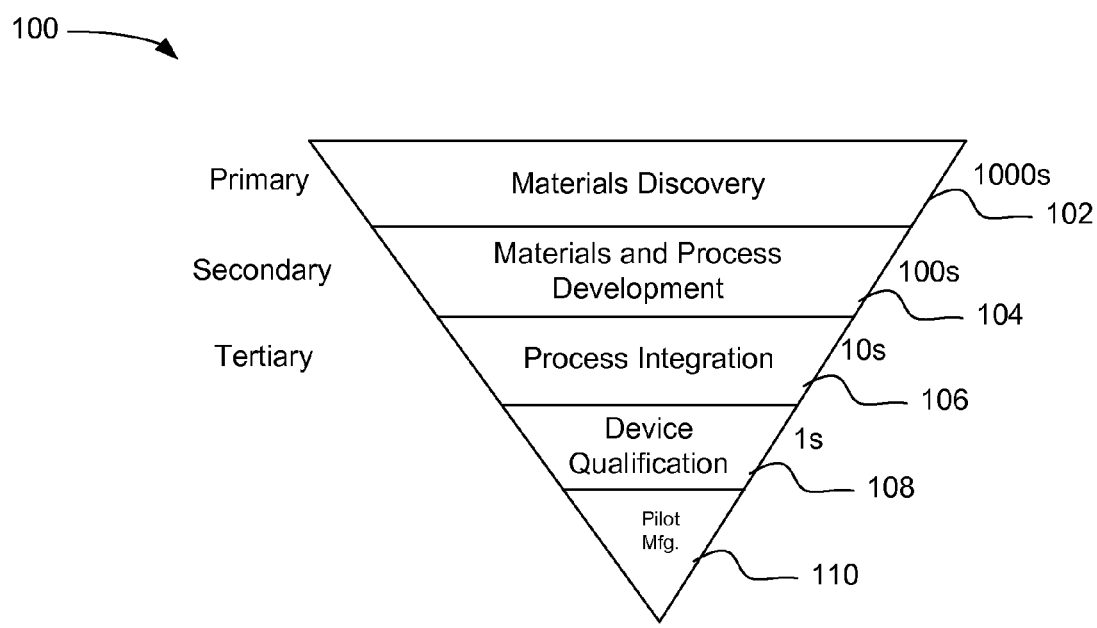
FIG. 1 illustrates a schematic diagram for implementing combinatorial processing.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, a workflow manager for a combinatorial processing system is described. The workflow manager can be used to track the lifetime of regions of a substrate, a substrate, or a group of substrates. The workflow manager allows one or more users to access data related to workflows. A workflow includes any selected information relating to regions of a substrate, a substrate, or a group of substrates. For example, a workflow may include a list of steps that have been performed on or are to be performed on a substrate, such as processing operations and metrology. The workflow also includes analyses performed on data collected regarding the substrate. The workflow manager allows one or more users to evaluate the results of combinatorial processing.

Combinatorial Processing

Combinatorial processing may include any processing (e.g., semiconductor processing) that varies the processing conditions in two or more regions of a substrate. A substrate may be, for example, a silicon or other semiconductor substrate such as a wafer or portion of a wafer that is used in semiconductor processing. The term "substrate" may include a coupon, which is a diced portion of a wafer, or any other device on which semiconductor processes are performed. A region of a substrate may be any portion of the substrate that is somehow defined, for example by dividing the substrate into regions having predetermined dimensions or by using physical barriers, such as sleeves, over the substrate. The region may or may not be isolated from other regions. For example, a substrate may be divided into two or more regions, each of which may or may not include semiconductor device structures (e.g., metallization such as interconnects and vias, active elements such as transistors, etc.) A process may be performed at each of the regions. For example, a first region is cleaned using a first cleaning agent, and a second region is cleaned using a second cleaning agent. The efficacies of the two cleaning agents are evaluated, and none, one, or both of the cleaning agents may be selected as suitable candidates for larger scale processing (e.g., on regions with structures, regions enabling more sophisticated testing or a full wafer). According to other examples, multiple of the same experiment is performed on the same substrate, and any number of regions may be defined. For example, five cleaning solutions may be tested using fifteen regions of a substrate, each cleaning solution being tested three times.

FIG. 1 illustrates a schematic diagram 100 for implementing combinatorial processing. The schematic diagram 100 illustrates that the relative number of combinatorial processes run on a substrate or group of substrates decreases as certain materials and/or processes are selected. Generally, combinatorial processing includes performing a large number of processes during a first screen, selecting promising candidates from those processes, performing the selected processing during a second screen, selecting promising candidates from the second screen, and so on.

For example, thousands of materials are evaluated during a materials discovery stage 102. Materials discovery stage 102 is also known as a primary screening stage performed using primary screening techniques. Primary screening techniques may include dividing wafers into coupons and depositing materials using varied processes. The materials are then evaluated, and promising candidates are advanced to the secondary screen, or materials and process development stage 104. Evaluation of the materials is performed using metrology tools such as electronic testers and imaging tools (i.e., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes are integrated into a device, which is produced and tested. The device is then evaluated to determine the efficacy of the selected materials and processes. If the device is successful, the device, including the screened materials and processes, can proceed to manufacturing 110.

The schematic diagram 100 is an example of various techniques that may be used to evaluate and select materials and processes for the development of semiconductor devices. The descriptions of primary, secondary, etc. screening and the various stages 102-110 are arbitrary and the stages may be described and performed in many other ways.

Combinatorial Processing System

Figure 2A:
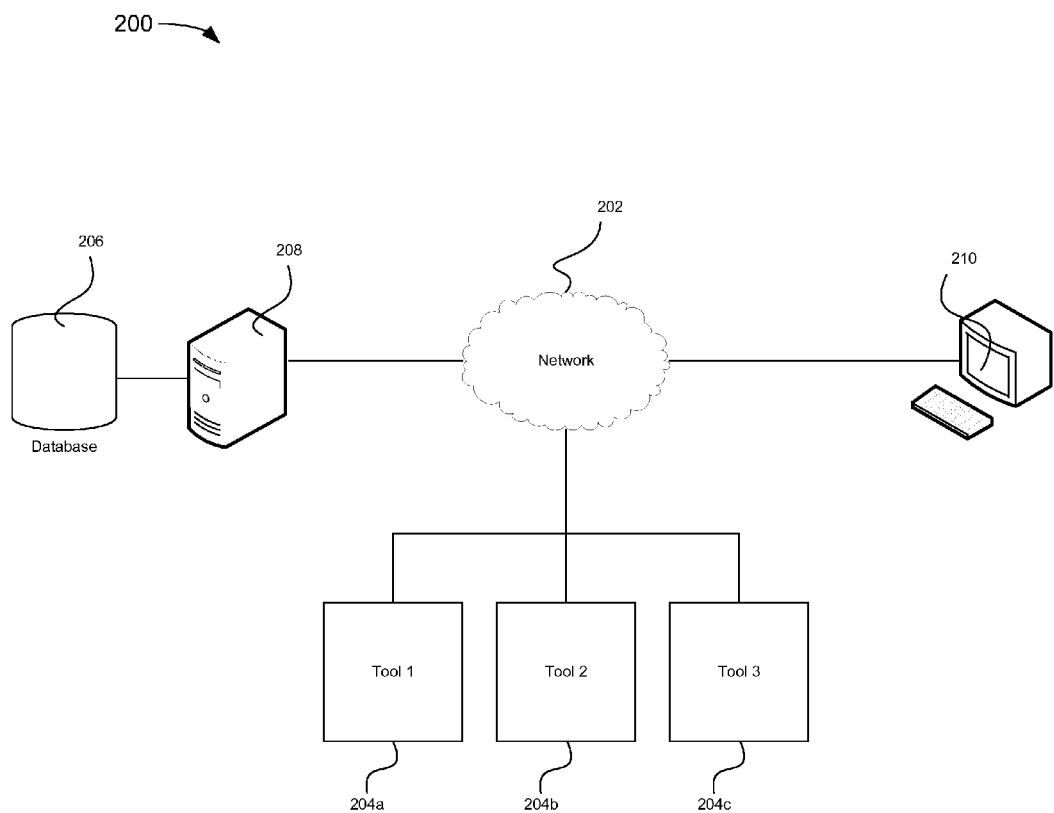
FIG. 2A illustrates a system for performing combinatorial processing and analysis.

FIG. 2A illustrates a system 200 for performing combinatorial processing and analysis. The system 200 can be used to perform semiconductor processes on a substrate, collect data from those processes, and analyze the data for use when evaluating combinatorial processing. For example, a user can process a substrate using a tool, the tool outputs data over a network to be stored in a database, and a server analyzes the data. A user can specify the various parameters of the processing and the analyzing, and the user can access the information from the database using a terminal.

The system 200 includes several subsystems connected through a network 202. Several tools 204 operate on substrates to perform the combinatorial processing. For example, the tool 204a is a combinatorial sputtering chamber, the tool 204b is a wet process combinatorial tool, and the tool 204c is a metrology tool such as an electronic tester. The tools 204 collect data when substrates are processed and transmit the data over the network 202. Various other tools can also be used with the system 200. For example, processing tools include chemical vapor deposition tools, atomic layer deposition tools, wet combinatorial processing tools, electroless deposition tools, electrochemical deposition tools, and so on. Wet combinatorial processing tools are those used to perform multiple aqueous or solvent-based processes in multiple regions of a substrate (e.g., post-etch cleans, electroless deposition). Metrology tools include ellipsometers (to measure thickness), mercury probes (to measure capacitance), imaging tools such as scanning electron microscopes (SEMs), transmission electron microscopes (TEMs), atomic force microscopes (AFMs), and so on.

The tools 204 may output data, such as process conditions or measurements, when a substrate is processed. The data generated by the tools 204 is stored in a database 206. The database 206 may be any data storage device such as magnetic or optical devices. The database 206 is, in some embodiments, managed by a server 208. The server 208 can be used to perform analyses (e.g., graphs, calculations) of the data, and to manage access to the database 206. A user accesses the database 206 using a terminal 210. The terminal 210 may be any input terminal such as a personal computer or workstation.

A user can define or review workflows, including recipes for using the tools 204 and analyses that have been and are to be generated from data collected by the tools using the terminal 210. A workflow, as used herein, may be a data structure that tracks the life of a substrate, group of substrates, and/or one or more regions on a substrate or across various substrates. The workflow includes, for example, lists and details of processing operations to be performed and that have been performed, recipes detailing the conditions of those processing operations, data collected from substrates when they are examined by processing or metrology tools, and analyses created using the collected data. In some embodiments, every time a substrate is operated on with a tool in the system 200, information from that operation is collected and stored in the workflow, and ultimately in the database 206.

A workflow manager (see FIGS. 4A-4E) can also be used to manage workflows and collect and disseminate data related to combinatorial processing. The workflow and workflow manager are also used to perform correlation between different regions of a substrate and different regions across multiple substrates. For example, during the processing of a substrate, four regions are processed using the same processing conditions. Data from these regions can be compared to determine the repeatability of certain of the processing conditions. For example, the four regions are examined to measure certain characteristics (e.g., resistance, capacitance), and that data can be compared and analyzed. If the comparisons of the data reveal that the same processing conditions result in the same outcome, the processing is repeatable.

In another example, comparisons between screening levels can be performed. A set of processing conditions can be performed using a secondary screen on a region of a first substrate. The same conditions are also performed during a tertiary screen on a region of a second substrate and device qualification on a third substrate. These substrates can be analyzed and the results of the processing can be compared to determine whether certain processing conditions correlate between combinatorial processing on regions of substrates and device qualification and manufacturing on full substrates.

The terminal 210 may be remote or local to the tools 204. For example, the terminal 210 is located at a location remote from the tools 204, and the network 202 is the Internet. A user can thus define a workflow to operate the tools 204 from any location. Alternatively, the terminal 210 may be local to the tools 204.

Multiple users can access workflows stored in the database 206. The system 200 can therefore be used collaboratively, and as a repository of information and data about experiments and processes performed on substrates. The data and the analyses stored in the database 206 can be shared amongst several users, and access rights can be granted to users. Access rights can be assigned to a workflow or a portion of a workflow. When a user tries to access that workflow, the system 200 determines whether the user has the appropriate access rights, and provides access to the user if the user has the appropriate access rights.

Figure 2B:
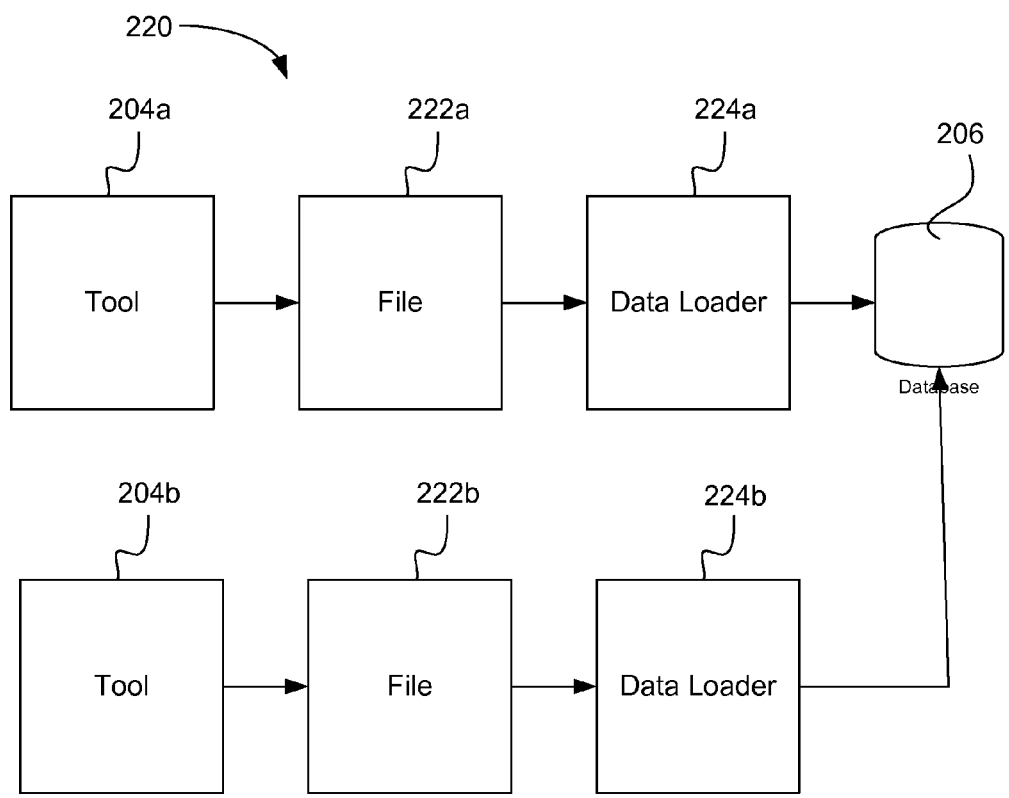
FIG. 2B illustrates a logical interface between processing and metrology tools and a database.

FIG. 2B illustrates a logical interface 220 between the tools 204 and the database 206. The tools 204 output a file 222 that includes data collected and recorded by the tools 204. Each of the tools 204a and 204b may output files 222a and 222b having a different format. Data loaders 224 are a software routine or program, for example, that are configured to receive the files 222 and output a common format into the database 206. The data loaders 224a and 224b are configured to handle files from the tools 204a and 204b, respectively. Data loaders 224 can be located anywhere with respect to the network 202. For example, the data loaders 224 can be implemented by the server 208.

Data Collection

Figure 3:
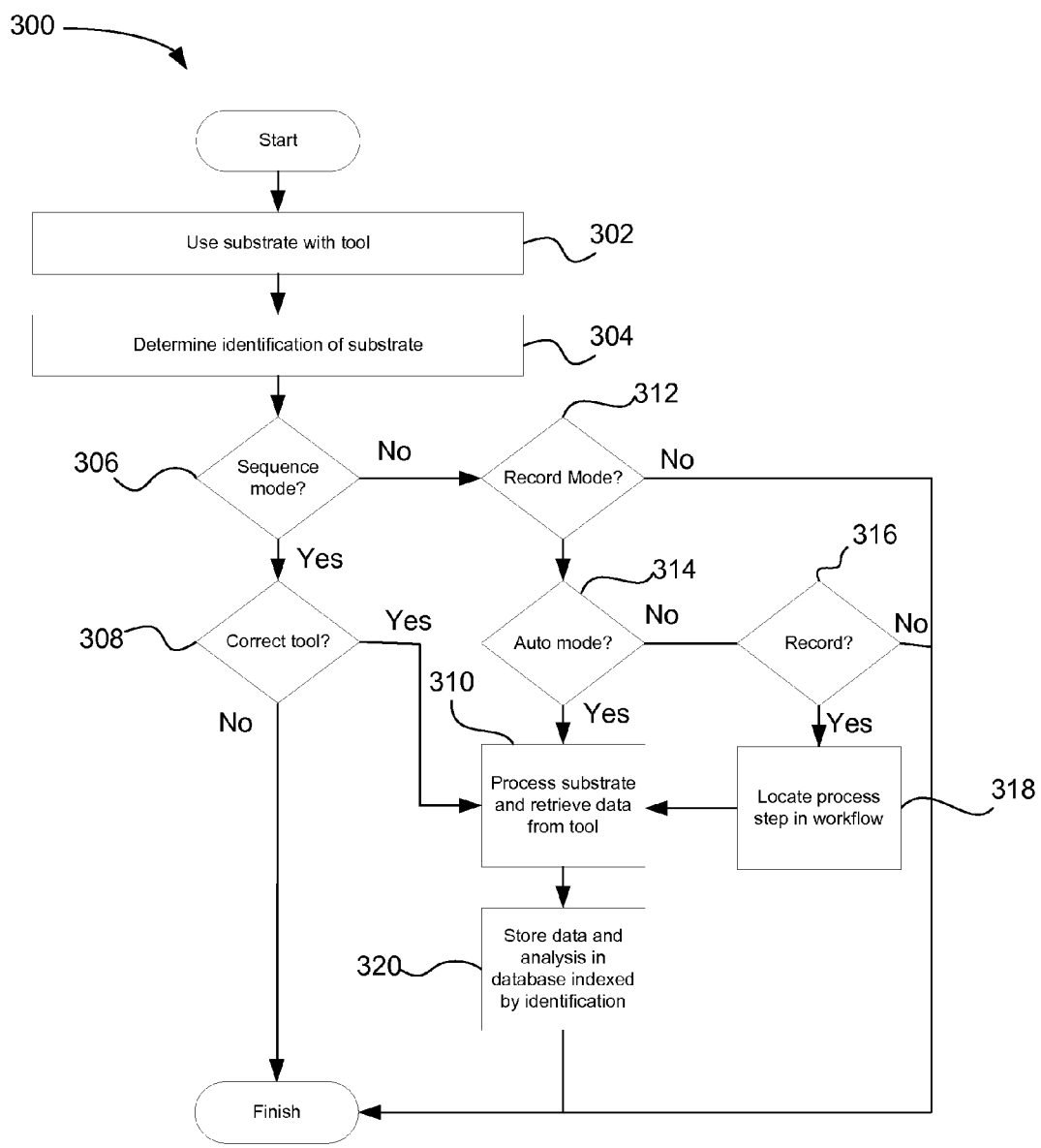
FIG. 3 illustrates a process for collecting data when a substrate is processed.

FIG. 3 illustrates a process 300 for collecting data when a substrate is processed. For example, a substrate is used with one of the tools 204, and data from the processing and/or examination of the substrate is stored in a workflow in the database 206.

In operation 302, the substrate is used with a tool. The substrate is used with a processing tool such as a sputtering tool or a metrology tool such as an electrical test tool. An operator inserts the substrate into the tool and the tool performs whatever operations are desired based on a recipe (see FIG. 4A, for example), which may be predefined in the workflow or selected at the time of inserting the substrate.

In some embodiments, the substrate is divided into multiple regions for combinatorial processing. Each of the regions can be processed in a combinatorial manner, and the results of the combinatorial processing can be collected, the results can be analyzed, and data including the results and the analyses can be stored in the database 206 so that any user with the appropriate access rights can find the data and analyses. In some embodiments, at least one of the multiple regions is processed differently from at least one of the other multiple regions. The data and analyses can be evaluated, and one or more of the processes can be used with another substrate for further processing.

In operation 304, an identification of the substrate is determined. Each substrate has a unique identification according to an embodiment. The identification is used to index data about the substrate in the database. Regions of a substrate may also be tracked. Each region may have a unique identification, which may be recorded in a region identifier field. The regions' identifications can also indicate a type of region, for example a blanket region or a patterned region.

A substrate may include a physical identification that may be machine readable, such as a barcode and/or an identification number that is recognizable by optical character recognition (OCR). Various naming conventions may be used for the identification, including combinations of dates, substrate types, processes used, fanciful names, etc. When a substrate is inserted into a tool, the tool can read the barcode or identification number, for example, to determine the identification of the substrate.

Regions of the substrate may be numbered according to location, size, or other convention, for example. In one embodiment, each region of a substrate is identified by a unique identification (e.g., region 1, region 2, etc.) The identification of each region can refer to and be indexed with a location of that region on the substrate. For example, region 1 may be centered at the coordinates (100, 100) and have a radius of 50. The definition of region 1 and other regions can be stored (for example in the database 206), so that metrology and other tools can locate the various regions based on their identification.

Data about the substrate may be collected using one of several different operating modes. The modes can be assigned to a substrate in the workflow. Three modes, sequence mode, record mode, and automatic ('auto') mode are described here.

In operation 306, it is determined whether the system is operating in sequence mode. Sequence mode is an operating mode where data is collected about the substrate in a predetermined sequence. Sequence mode is used where an operator has been given instructions by a designer of the experiment (e.g., a scientist or engineer). For example, in sequence mode, the operator of the experiment follows a series of steps defined in the workflow. If the system is not in sequence mode, the process 300 continues to operation 312. If the system is in sequence mode, the process 300 continues to operation 308, where it is determined whether the tool in which the substrate was inserted is the correct tool for the next step in the workflow. If the tool is the appropriate tool, in operation 310, the substrate is processed and data is retrieved from the tool. Processing the substrate includes the tool performing whatever function has been assigned to the tool. For example, processing may include depositing a layer according to certain conditions, or performing a test of the substrate. If, in operation 308, it is determined that the tool is not the correct tool, the process 300 finishes.

Alternatively, when in sequence mode, a user may be allowed to perform process steps out of sequence or not perform some process steps. For example, the workflow may specify that step 1 is to be performed on tool 1, step 2 on tool 2, and step 3 on tool 3. If the user performs step 1 on tool, and then inserts the substrate into tool 3, step 3 can still be carried out, and a notation that step 2 was not performed can be added to the workflow.

In operation 312, it is determined whether the system is operating in record mode. Record mode is an operational mode where an operator (e.g., a scientist or engineer) processes a substrate, and determines whether the data from the processing is to be entered into the workflow and the database at the time of processing. In record mode, the operator may determine that the data should not be collected for a particular process operation. For example, an operator may be repeating an operation several times, and may not want data from each iteration to be stored in the workflow. Data from record mode may include data about the conditions of the operation (e.g., chemical compositions, durations, temperatures), as well as observed data (e.g., resistance, capacitance). In record mode, for example, the process steps are defined in the workflow, and the user of the tool can perform each step in any sequence.

If, in operation 312, it is determined that the system is not in record mode, the process 300 finishes. If the system is in record mode, in operation 314, it is determined whether the system is in auto mode. Auto mode is, in some embodiments, a subset of record mode. In operation 314, if it is determined that the system 200 is not in auto mode, the process 300 continues to operation 316, where it is optionally determined whether the user wants to record data from the processing of the substrate. If the user does not want to record the data, the process 300 finishes. If the user does want to record the data, in operation 318, the process step for the tool is located in the workflow. The specific process conditions are then obtained, and in operation 310, the substrate is processed and data about the processing is retrieved from the tool.

Auto mode is an operating mode where data from processing the substrate is automatically transmitted to the database whenever the substrate is processed. Auto mode allows a user to keep track of anything that happens to a substrate, regardless of who performs the processing, and regardless of whether or not a process step exists in the workflow for the substrate. If, in operation 314, is determined that the system 200 is in auto mode, the process 300 continues to operation 310, where the substrate is processed and data is retrieved from the tool.

After the substrate is processed in operation 310, in operation 320, the data is stored in the database 206, indexed by the identification of the substrate. Analyses of the data can also be created and stored in the database 206. In some embodiments, the analyses include comparisons between multiple processes performed on multiple regions of the substrate. The analyses may compare, for example, the result of processing one region of a substrate that is processed differently from another region of the substrate. These analyses can then be evaluated and used to select processes for further testing on another substrate. The analyses can be predefined by a user and stored in the workflow. When the analysis is performed, the user can examine the analyses (e.g. graphs, images, or a table) and determine whether to save the analysis and data, or to discard it.

In another embodiment, a user can abort the process 300 at any time. The process 300 can be aborted because of a problem with the substrate, for example, and aborting the process stops recording data of the processing. A notation that the process was aborted is added to the workflow, so that users accessing data about the substrate will be aware that there was an issue that resulted in an abort. The user that aborted the process 300 can indicate, in a notes section of the workflow, for example, that the substrate is damaged or another reason for the abort. In one embodiment, aborting the process 300 prevents the substrate from being used again, and ends the workflow for the substrate. According to a further embodiment, the abort can be cancelled, which allows the substrate to be used again.

Workflow Manager

Figure 4A:
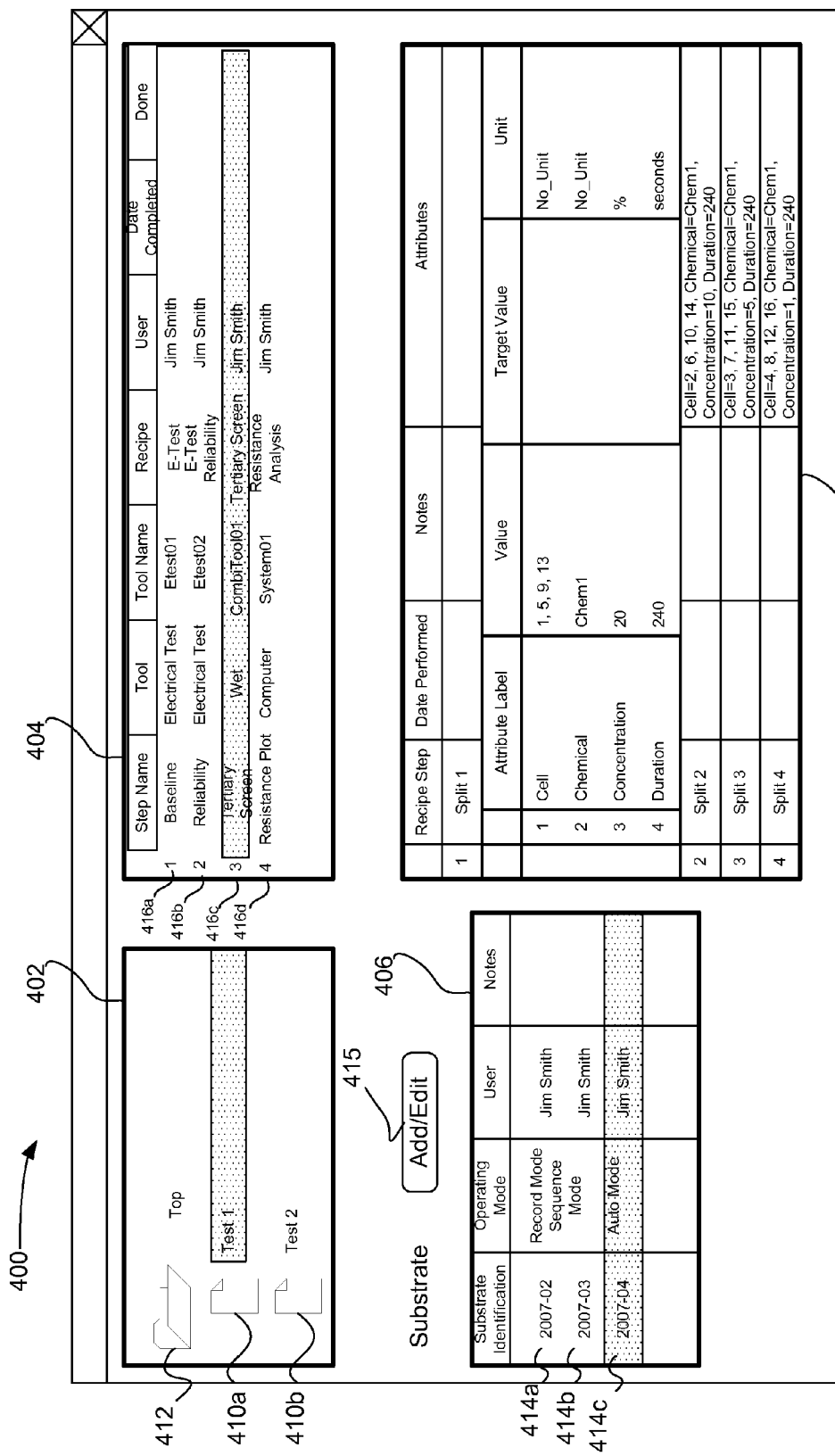
FIG. 4A illustrates a workflow manager for creating and modifying a workflow for use with combinatorial processing.

FIG. 4A illustrates a workflow manager 400 for creating and modifying a workflow for use with combinatorial processing. The workflow manager 400 allows a user to change the specifications of a workflow and see what processes have occurred and what the results of those processes were. Further, the workflow manager 400 allows a user to track the lifetime of a substrate or a group of substrates, including regions of those substrates, and to observe what processes have been performed on the substrate. As mentioned above, a substrate may be a full wafer or any portion thereof, such as a coupon. The workflow manager 400 can also be used to perform correlation between processes performed on one or more substrates (see FIG. 4E).

The workflow manager 400 is divided into several windows: a workflow selection window 402, a process operation list window 404, a substrate selection window 406, and a recipe window 408. The workflow selection window 402 allows for the organization of workflows. For example, two workflows 410a and 410b are located in a folder 412. The highlighted workflow 410a is currently being displayed in detail in the workflow manager 400. The workflow selection window 402 presents an organizational structure of the available workflows to the user, and although shown in a particular layout here, may be implemented in any desired fashion.

The substrate selection window 406 shows the substrates 414 that belong to the selected workflow 410a. The list of substrates shown in the substrate selection window 406 can be added to or edited using an add/edit button 415, for example. Each substrate 414 has a corresponding identification, operating mode, associated user, and notes. The identification of the substrate is used to track and index data and analyses related to the substrate when the substrate is used with processing and metrology tools. Each substrate 414 can be assigned an operating mode (e.g., record, sequence or auto mode), so that when the substrate is processed or examined, the appropriate actions regarding data collection are taken. As is shown here, for example, the highlighted (i.e., active) substrate 414c is in auto mode, and every time the substrate 414c is used with a tool, the data is automatically collected and transmitted to the database 206.

The process operation list window 404 shows the various steps 416 of the workflow 410a. The recipe for the highlighted step 416c (i.e., the "Tertiary Screen" recipe) is shown in the recipe window 408. An example of the process operation list window 404 is shown in more detail in FIG. 4B.

The recipe window 408 allows a user to view, make changes to, and create a recipe. For example, a recipe to perform a tertiary screen may include 16 separate combinatorial processes (e.g., performed in regions of a substrate, or isolated cells). The sixteen cells can be divided into four "splits", so that the same process conditions are repeated in four different cells. For example, the process conditions shown in the split 1 are performed in cells 1, 5, 9, and 13. As shown here, a chemical having a specified concentration (e.g., 20%) is deposited for a specified duration (e.g., 240 seconds). Various other attributes can be modified and controlled using the recipe. Other attributes, such as wafer chuck temperature, ambient temperature, etc., may also be viewed or modified using the recipe window 408.

Additionally, a target value can be displayed. In a recipe that has been performed, the target value is the value which was desired, and the value is the measured value of the actual processing. In this way, data collected from processing can be presented to a user.

Although a specific layout of the workflow manager 400 is shown here, any desired layout or appearance can be used. Additionally, various other attributes may be used instead of or in addition to those described here with the recipe window 408. Alternatively, a recipe can be created or modified using a separate software program known as a recipe manager. Recipes, their creation, and a recipe manager are described in more detail in U.S. patent application Ser. No. 11/771,836, entitled "Substrate Processing Recipe Manager" and filed on Jun. 29, 2007.

Figure 4B:
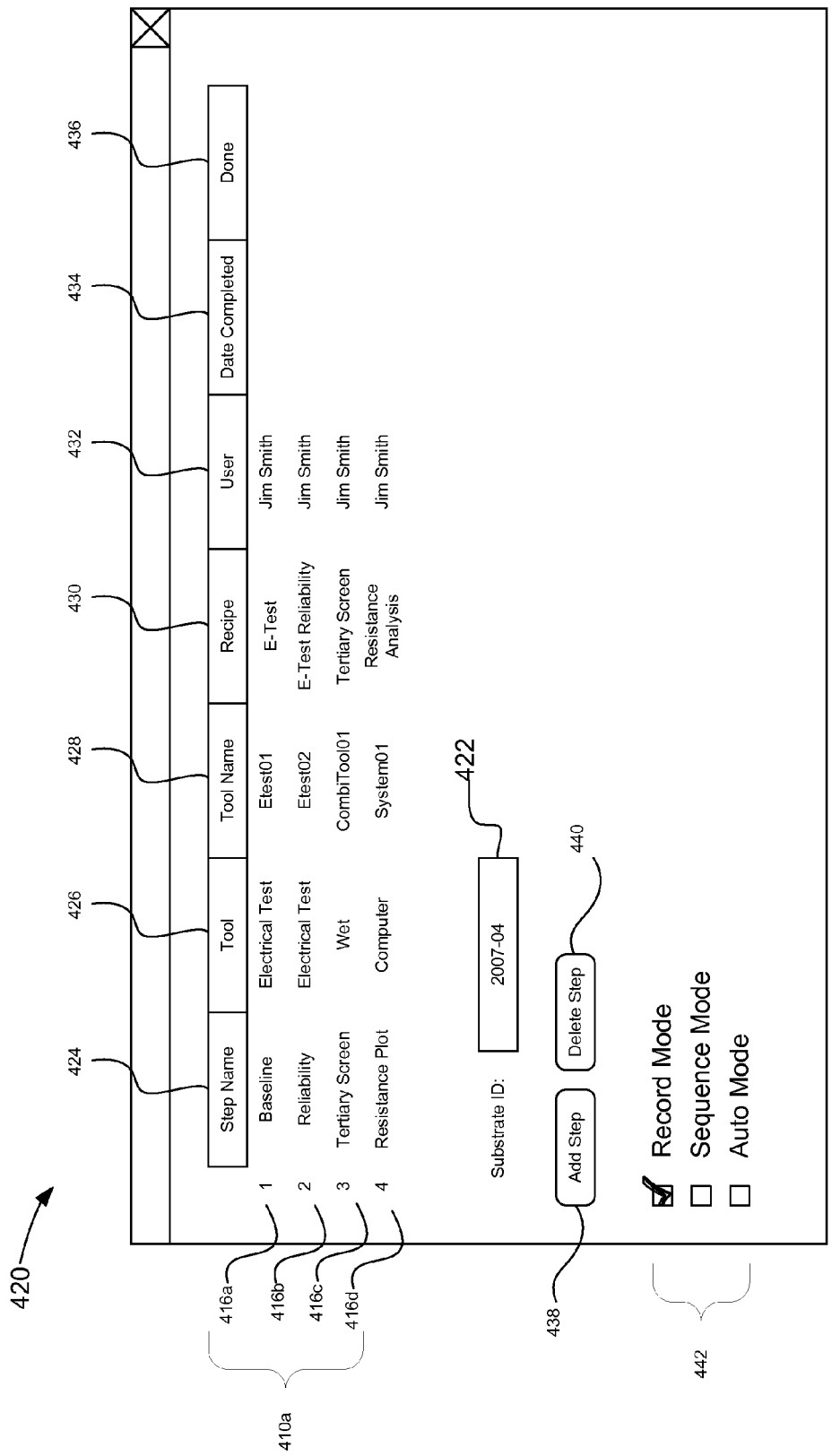
FIG. 4B illustrates editing a workflow in a workflow window.

FIG. 4B illustrates editing a workflow 410 in a separate workflow window 420. The workflow window 420 is used to track the lifetime of a substrate. The workflow window 420 can be displayed separately or as part of the workflow manager display as shown in FIG. 4A. For example, the window 420 may be displayed as the workflow operation list window 404. Each substrate has an identification 422 that is used to index the substrate in the database and to locate data related to the substrate. The workflow 410 may include a list of steps 416a-416d that include processes that have been or are to be performed on the substrate, data relating to the substrate, and analyses that have been or are to be created from that data. A user can define portions of the workflow 410 using the window 420. For example, if the user wishes the system to operate in sequence mode (see FIG. 3), the user can define the steps 416. If the user wants to operate in record or auto mode, the user does not need to enter the steps 416, and they are entered when the substrate having the identification 422 is processed.

Several columns 424-436 list information about the steps 416. The column 424 provides a name of the step, the column 426 is a type of tool on which the step is to be performed, the column 428 is a name of the tool, column 430 lists a recipe to perform the step, the column 432 is a user that is associated with the step, the column 434 is a date on which the step was or is to be performed, and the column 436 lists whether or not the step has been completed.

Using the step 416a as an example, the step 416a is a baseline test to be performed using an electrical testing metrology tool. The name of the tool used is 'Etest01', the user is Jim Smith, and the test is to be performed on Sep. 14, 2007. The test has not yet been performed.

The step name in the column 424 is arbitrarily chosen by the author of the workflow. Alternatively, the step name is selected from a group of preselected names. The tool type in the column 426 describes each tool functionally, or a category to which the tool belongs. For example, the tool type used for the step 416a is an electrical test tool. The tool name in column 428 is any name assigned to a specific tool. For example, there are two electrical test tools, 'Etest01' and 'Etest02'. The tools may have different specifications, but similar functions, or may be redundant, for example. The tool used for step 416a is 'Etest01.'

The column 430 lists recipes for performing the steps 416, and the column 432 lists a user associated with the steps 416. The user associated with the steps may be the user that created the steps, and/or may be users that have been granted access to the data created by the steps 416. When the steps 416 have been performed, the date of their completion and the fact that they have been completed are listed in columns 434 and 436, respectively. Alternatively, the column 434 may also list an anticipated date of completion.

A user adds steps 416 using the 'Add Step' button 438, and deletes steps using the 'Delete Step' button 440. Selecting the 'Add Step' button 438 launches a dialogue that allows a user to enter the information displayed in the columns 424-436. The dialogue may include pull-down menus to allow a user to select from a list of options, text-entry boxes, or other data entry techniques.

Steps 416 can also be added using the record mode and auto mode, for example. The user can select the operating mode of the substrate using the check-boxes 442, for example. If a user processes a substrate using a PVD tool and the substrate is in record mode, for example, a fifth step can be added to the workflow 410, even if the fifth step was not previously added by the user. The fifth step includes data collected from the tool during processing, including the tool, tool name, recipe used, user, etc.

Three categories of steps are shown here: the steps 416a and 416b are performed using metrology tools to collect parametric data, the step 416c is a performed using a processing tool to process the substrate, and the step 416d is performed using a computer to provide analysis of collected data. When the steps 416a and 416b are performed, the parametric data (e.g., microscope images, measurements) can be indexed into the database 206 and can be made accessible through the workflow window 420 or another interface. When the step 416c is performed, data relating to the process (e.g., operating conditions) can be stored in the database 206.

Figure 4C:
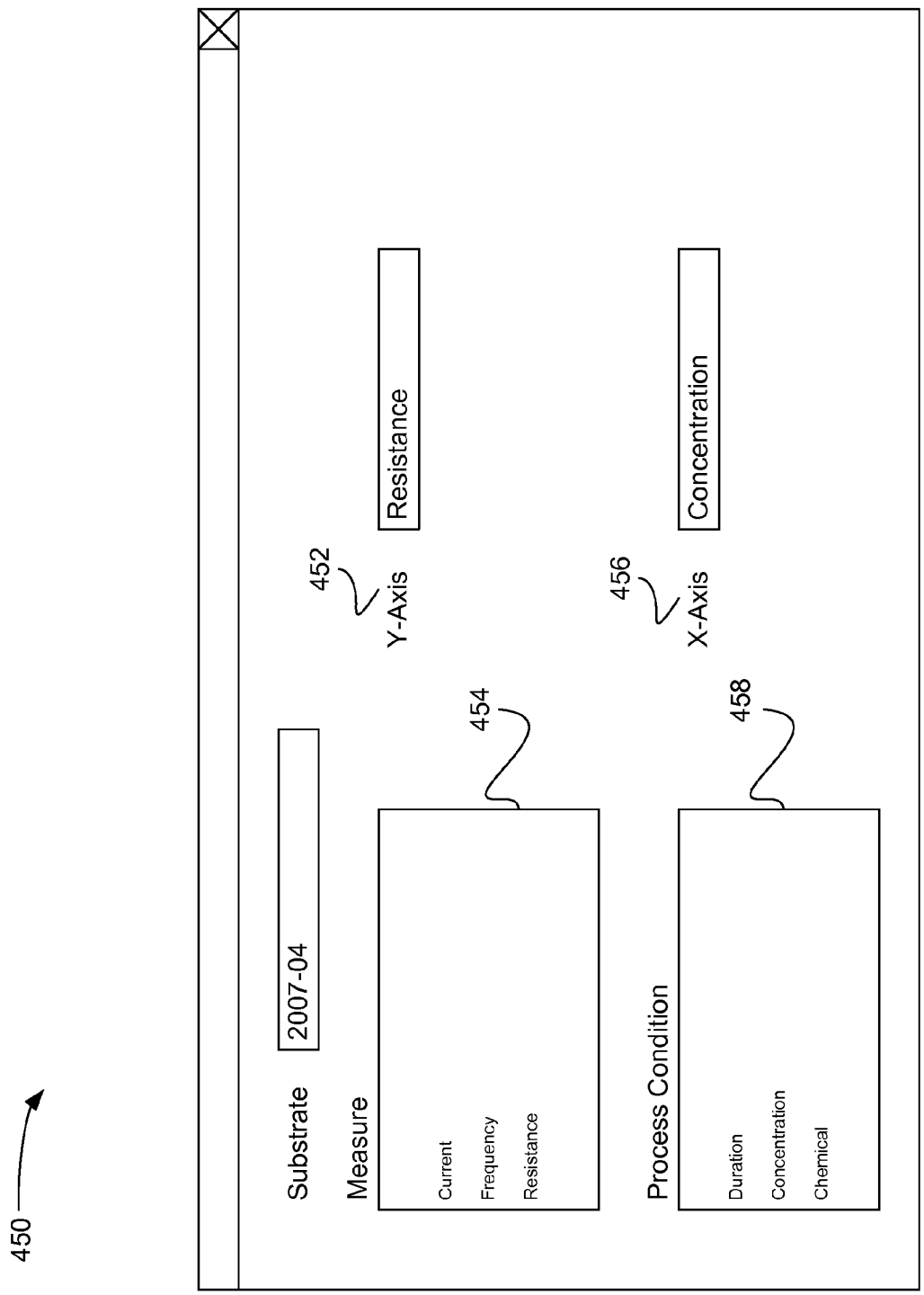
FIG. 4C illustrates an analysis window for defining an analysis of collected data.

With the analysis performed in step 416d, data from other steps (e.g., the parametric data from steps 416a and 416b) can be manipulated according to the recipe (e.g., the "Resistance Analysis" recipe) to create the analysis. FIG. 4C illustrates an analysis window 450 for defining an analysis of collected data. The analysis window 450 allows a user to create a graph using data collected over time from a series of processing experiments. The user can designate the y-axis 452 of the graph by selecting from a list 454 of measurements. For example, as shown here, the user has selected resistance to display along the y-axis 452 of the graph. The user can also select the x-axis 456 of the graph using a list 458. For example, as shown here, the user is plotting the concentration of the solution used to process the substrate.

Although defining a graph is shown and described here, it is understood that various other analyses may be performed. For example, calculations can be performed using the data or raw data can be exported to other formats.

Figure 4D:
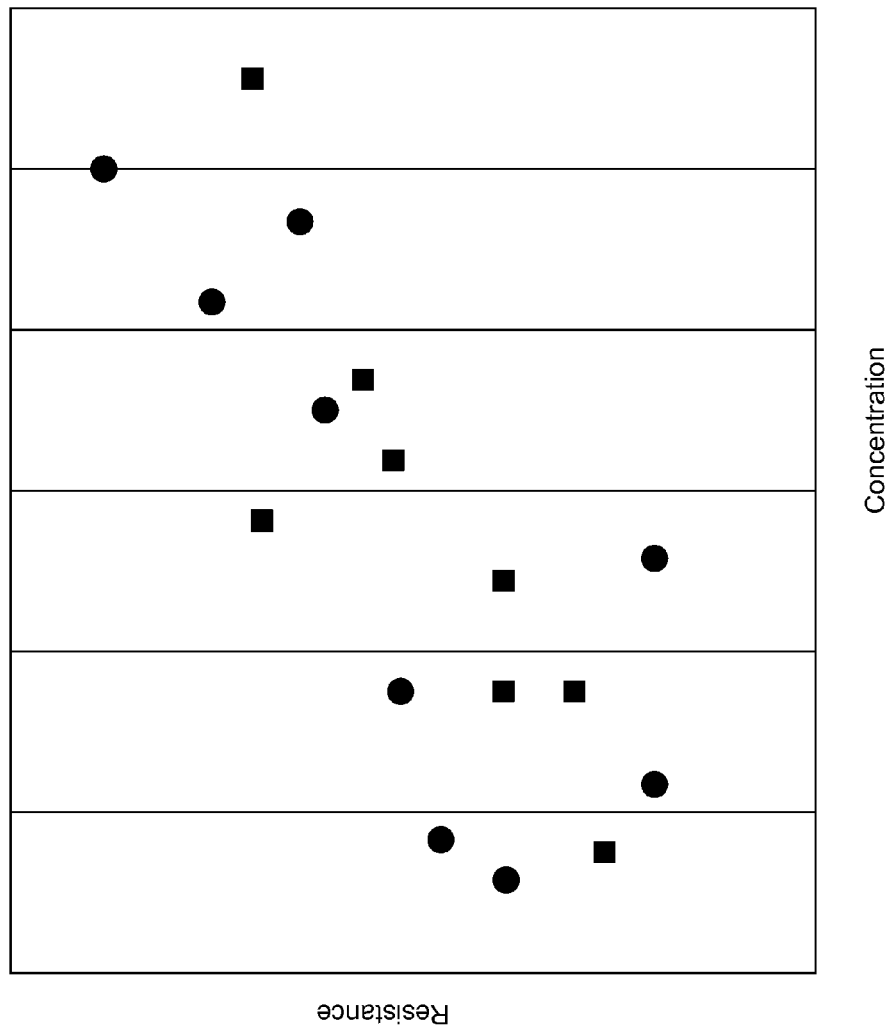
FIG. 4D illustrates a graph generated from a defined analysis.

FIG. 4D illustrates the resulting graph 470, which shows the resistance measured across the substrate depending on the concentration of the solution used to process areas of the substrate. As shown here, each plot on the graph represents a resistance value taken in a different region of the substrate. For example, using a substrate with multiple regions, the concentration of processing solutions can be varied. The graph 470 may reveal that certain concentrations of chemicals result in too low a current, for example. As shown in FIG. 4D, for example, the resistance generally trends upward as concentration increases. This information may be useful when evaluating various combinatorial processes.

Additionally, the graph 470 may be any type of graph. As shown here, circles and squares are used for the plots. Circles may represent measurements taken from one type of substrate (e.g., patterned), while squares represent measurements taken from another type of substrate (e.g., blanket). Additionally, other types of graphs, such as bar graphs, line graphs, pie charts, etc., can also be generated.

Figure 4E:
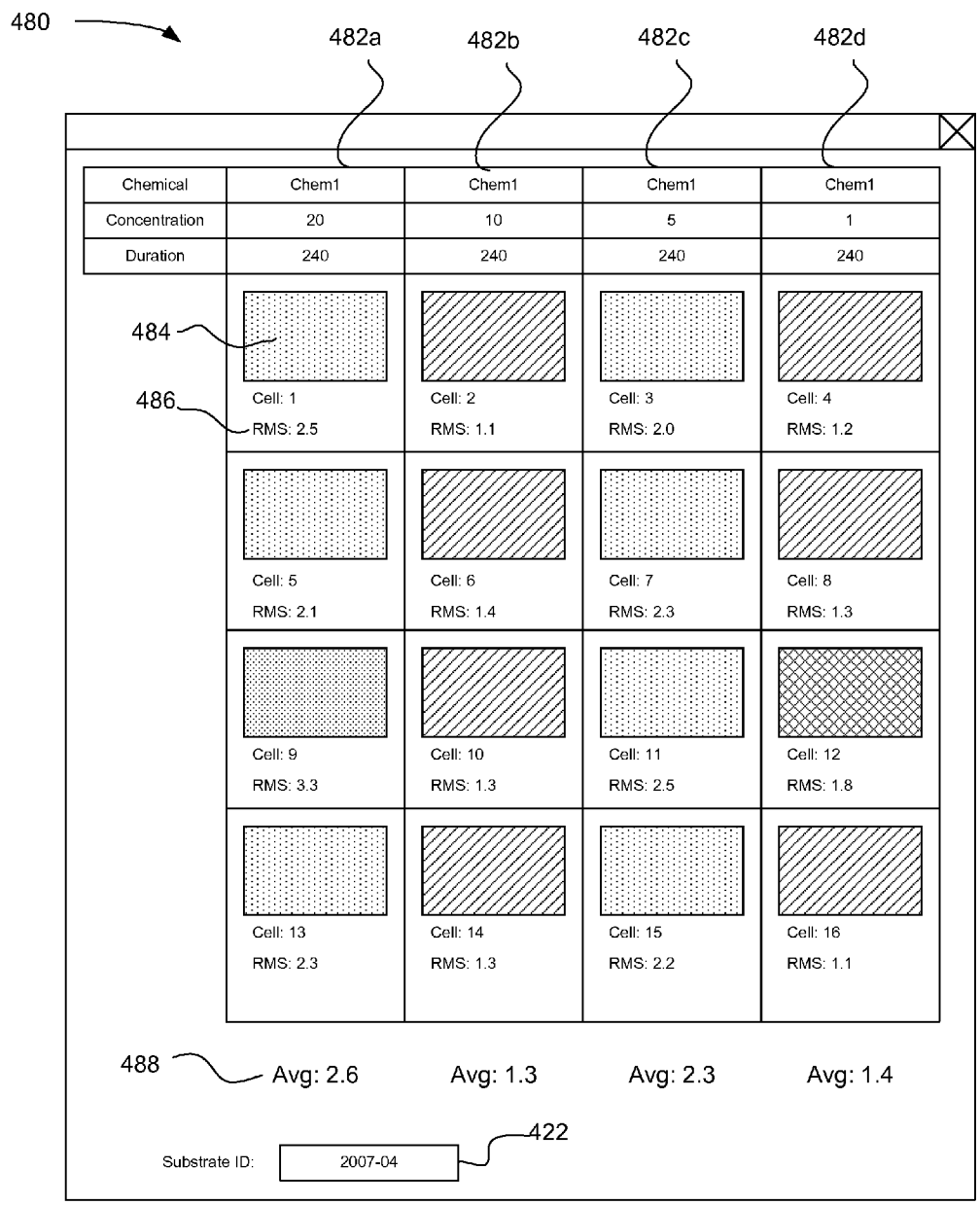
FIG. 4E illustrates displaying results from the processing of regions of a substrate and performing correlation of the regions of the substrate.

FIG. 4E illustrates displaying results from the processing of regions of a substrate and performing correlation of the regions of the substrate. In some embodiments, these displayed results can be considered or can include analysis of the processing. Correlation is used to compare similar process conditions across one or more substrates and/or screening levels. For example, a results and correlation window 480 includes four columns 482 corresponding to four different process conditions. The process conditions may be those specified in the recipe shown in the recipe window 408, for example. For example, each split of cells uses the chemical Chem1 for 240 seconds. Split 1 in column 482a (i.e., cells 1, 5, 9, and 13) use the chemical Chem1 in a concentration of 20, while split 2 in column 482b uses the chemical Chem1 in a concentration of 10, split 3 in column 482c uses the chemical Chem1 in a concentration of 5 and split 4 in column 482d uses the chemical Chem1 in a concentration of 1. The results of cells having similar or the same process conditions are organized in the columns 482. The results include an image (e.g., an AFM image) 484 and a root mean squared (RMS) value 486. The RMS value 486 may be an analytical value derived from the image 484, for example. The average 488 of the RMS values is given for the entire column. In this way, cells having similar process conditions can be compared across regions. With the correlation window 480, a user can determine whether certain process conditions are repeatable, can compare multiple results to obtain an average result for multiple instances of similar conditions, and can determine whether certain results are not reliable.

In addition to comparisons across regions on a single substrate, regions having similar processing conditions across multiple substrates can also be compared. Additionally, results can be compared across screening levels. For example, similar process conditions can be performed on three substrates: one using a primary screen, one using a secondary screen, and one using a tertiary screen. These results can be compared (e.g., in one of the columns 482) to determine the level of correlation between the screening levels. If there is good correlation between the screening levels (i.e., if similar results are obtained when using similar conditions), or between various screens and device qualification, for example, the particular set of process conditions may be a good candidate for manufacturing. The verification of the results across screening levels and device qualification in this manner can be used to identify useful processing conditions and/or materials.

In another embodiment, a user can use the workflow manager 400 to specify a particular set of results that the user wishes to obtain. For example, a user could specify a set of materials that the user wants to use, and a set of post-process characteristics (e.g., resistance, capacitance, and leakage) that the user wishes the materials to have. The system 200 can search the database 206 for results that are similar to those desired by the user. The system 200 can then suggest compositions or process conditions that return the desired results.

Executing a Workflow

Figure 5:
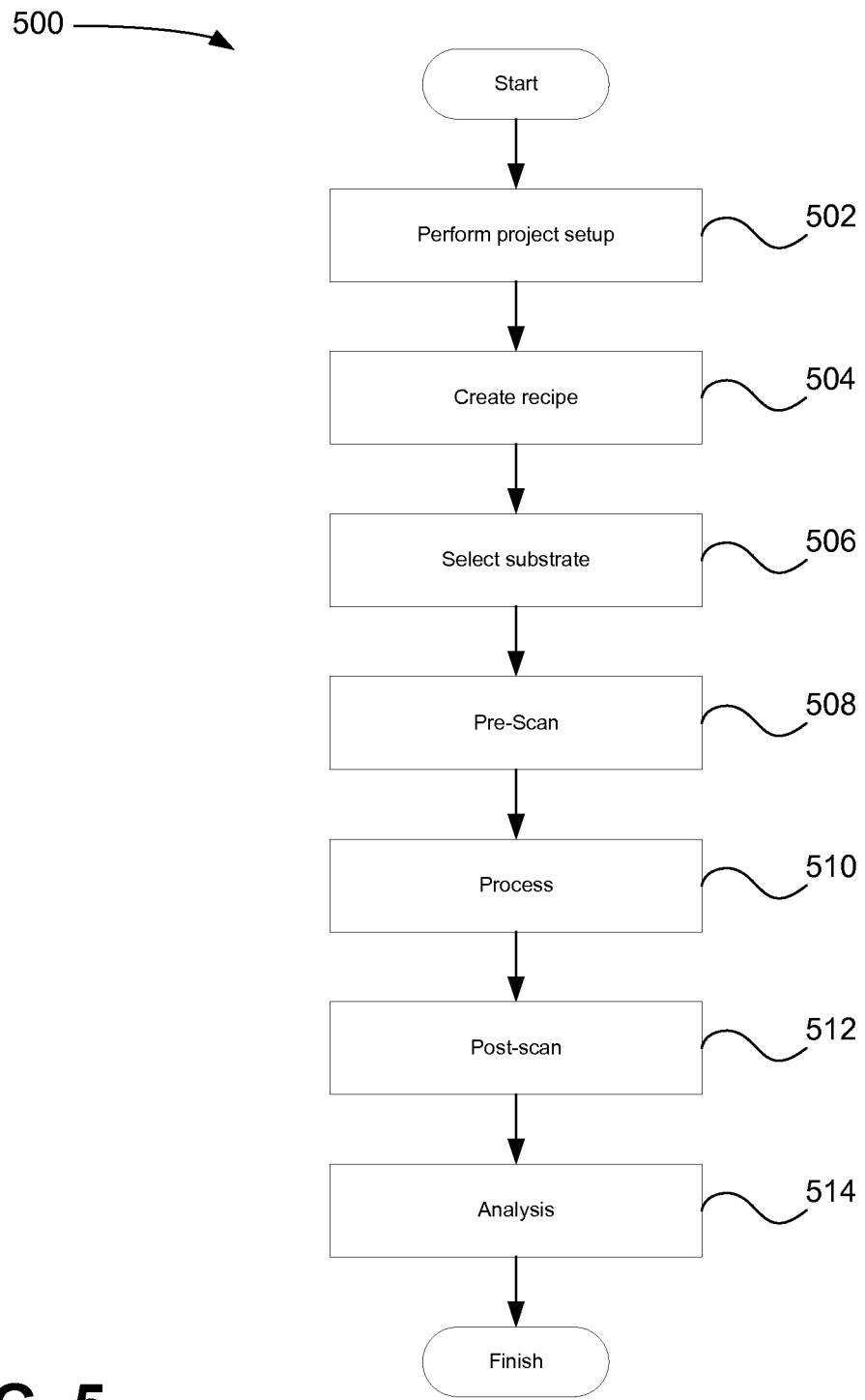
FIG. 5 is a flowchart illustrating a process for executing a workflow.

FIG. 5 is a flowchart illustrating a process 500 for executing a workflow. The process 500 describes several operations that a user can use to perform combinatorial processing using the workflow manager 400 and the system 200. The process 500 is an example of the creation of a workflow and the performance of combinatorial processing. Although certain operations and an order of operations are shown here, it is understood that any order may be used, and that some operations may be omitted while others are added or modified.

In operation 502, the workflow setup is performed. The setup includes several individual operations, such as a user defining the workflow and the operations. The setup may include, for example, the user defining the steps 416 using the workflow window 420. The workflow setup may be as simple as naming a new workflow and adding a substrate (see operation 506). The workflow setup may include operations 504 and 506.

In operation 504, a recipe is created. The recipe may include a chemical library defined by the user. The recipe includes chemical compositions that are used with each region, as well as process conditions and other attributes. For example, on a substrate with 16 different regions, 4 splits may be defined. Each split defines a different chemical composition that is deposited at four regions. The recipe can be created using the recipe window 408, for example.

In operation 506, a substrate is selected. The substrate may have been previously registered with the system, and the identification of the substrate may be chosen from a list. Alternatively, the substrate to be operated on may be a new substrate, which is assigned an identification.

In operation 508, the substrate is pre-scanned (optional). The pre-scan is a baseline evaluation of the wafer on a metrology tool. For example, the wafer is placed into an e-test tool before the wafer is processed to provide preliminary data.

In operation 510, the substrate is processed. The substrate is processed using a combinatorial processing tool, for example, that processes multiple regions of the substrate. The multiple regions may include at least one region that is processed differently from another region. Alternatively, all regions could be processed using the same conditions and/or materials and compared to verify the proper and corresponding functioning of each reactor.

In operation 512, a post-scan of the substrate is performed. The post-scan uses a metrology tool to examine the substrate after the processing. The post-scan is used to evaluate the combinatorial processes, and the data is used to perform the analyses defined by the user. In other embodiments, in-situ measurements or other measurements are performed during the processing (e.g., in between steps) of operation 510.

In operation 514, analyses are performed and reports are created. The analyses are created using the data gathered during the pre-scan in operation 508 and the post-scan in operation 512, as well as measurements taken during processing (e.g., in-situ measurements). The recipe created in operation 504 can be used in conjunction with the measurements and data to create the analyses. The analyses are used to evaluate the efficacy of the various combinatorial processes. The processes and/or compositions that are effective can then be selected to advance to a subsequent stage of screening or used with full-scale (e.g., on an entire substrate such as a wafer) or manufacturing processing.

Some analyses can be used to compare regions with similarly processed regions on other substrates or with regions processed using other screening levels (e.g., comparing secondary screening with tertiary screening). For example, the column 482a that displays results (which may also indicate a level of correlation) is an example of an analysis comparing two similarly processed regions.

The analyses are defined by a user and placed in the workflow, for example using the analysis window 450. The analyses can be generated using any format. For example, an analysis may be a table or graph that is output as a spreadsheet, presentation, or line image. The analysis may be exported using a common file format such as a Microsoft Excel file or a Microsoft PowerPoint file. The analyses can then be stored in the database 206.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of selecting processing conditions in the manufacture of a semiconductor device comprising:
    a. identifying at least one substrate, each substrate with a first unique identification, wherein the first unique identification is used as an index in a database, wherein each substrate further comprises more than one region, each region with a second unique identification;
    b. performing a process operation on each region according to a recipe of process conditions, wherein the recipes of process conditions are varied in a combinatorial fashion among the regions, wherein the process operation is one of a sputtering operation, a wet process operation, a metrology operation, a chemical vapor deposition operation, an atomic layer deposition operation, an electroless deposition operation, or an electrochemical deposition operation;
    c. collecting and storing data associated with each process operation in a database wherein the data is associated with each region's unique identification;
    d. measuring at least one result of the process operation on each of the regions and storing the results of the measurement in a database, wherein the results of the measurement are associated with each region's unique identification;

e. analyzing the data associated with each process operation and the results of the measurement; and f. selecting candidate recipes of processing conditions based on the analysis.

2. The method of claim 1 wherein the data comprises one or more of chemical composition, duration, wafer chuck temperature, or ambient temperature.

3. The method of claim 1 wherein the results of the measurement comprises one or more of thickness, resistance, capacitance, surface morphology, or surface roughness.

4. The method of claim 1 wherein the analysis of the data associated with each process operation and the results of the measurement comparisons between multiple process operations performed on multiple regions of the substrate.

5. The method of claim 1 further comprising generating a workflow for candidate recipes of processing conditions in the manufacture of a semiconductor device, the workflow comprising:

a) assigning each substrate with a first unique identification wherein the first unique identification is used as an index in a database, wherein each substrate further comprises more than one region, each region with a second unique identification; and b) defining recipes of process conditions for each of the process operations by varying the process conditions of the recipes in a combinatorial fashion among the regions.

6. The method of claim 1 wherein the collecting and storing of data associated with each process operation is accomplished using sequence mode, wherein sequence mode comprises the steps of:

a) determining that the processing system is correct, b) processing the substrate and collecting and storing data associated with each process operation in a database wherein the data is associated with each region's unique identification;

c) measuring at least one result of the process operation for each of the regions and storing the results of the measurement in the database, wherein the results of the measurement are associated with each region's unique identification;

d) analyzing the data associated with each process operation and results of the measurement data; and e) selecting candidate recipes of processing conditions based on the analysis.

7. The method of claim 1 wherein the collecting and storing of data associated with each process condition is accomplished using record mode, wherein record mode comprises the steps of:

a) determining that the data collection is not in sequence mode;

b) determining that the data collection is not in auto mode;

c) determining that data collection is desired for a process step;

d) processing the substrate and collecting and storing data associated with each process operation in a database wherein the data is associated with each region's unique identification;

e) measuring at least one result of the process operation for each of the regions and storing the results of the measurement in the database, wherein the results of the measurement are associated with each region's unique identification;

f) analyzing the data associated with each process operation and results of the measurement data; and g) selecting candidate recipes of processing conditions based on the analysis.

8. The method of claim 1 wherein the collecting and storing of data associated with each process condition is accomplished using auto mode, wherein auto mode comprises the steps of:

a) determining that the data collection is not in sequence mode;

b) determining that the data collection is in record mode;

c) determining that the data collection is in auto mode;

d) processing the substrate and collecting and storing data associated with each process operation in a database wherein the data is associated with each region's unique identification;

e) measuring at least one result of the process operation for each of the regions and storing the results of the measurement in the database, wherein the results of the measurement are associated with each region's unique identification;

f) analyzing the data associated with each process operation and results of the measurement; and g) selecting candidate recipes of processing conditions based on the analysis.

* * * * *